United States Patent
Tempel

(10) Patent No.: US 6,787,843 B2
(45) Date of Patent: Sep. 7, 2004

(54) NONVOLATILE SEMICONDUCTOR MEMORY CELL AND ASSOCIATED SEMICONDUCTOR CIRCUIT CONFIGURATION AND METHOD FOR THE FABRICATION OF THE CIRCUIT CONFIGURATION

(75) Inventor: Georg Tempel, Sterrebeek (BE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/462,514

(22) Filed: Jun. 16, 2003

(65) Prior Publication Data

US 2004/0042296 A1 Mar. 4, 2004

Related U.S. Application Data

(63) Continuation of application No. PCT/DE01/04006, filed on Oct. 22, 2001.

(30) Foreign Application Priority Data

Dec. 14, 2000 (DE) .......................................... 100 62 245

(51) Int. Cl.$^7$ ............................................ H01L 29/788
(52) U.S. Cl. ....................................... 257/315; 257/324
(58) Field of Search .................................. 257/315, 324

(56) References Cited

U.S. PATENT DOCUMENTS

| | | |
|---|---|---|
| 5,053,840 A | 10/1991 | Yoshikawa |
| 5,210,047 A | 5/1993 | Woo et al. |
| 5,589,413 A | 12/1996 | Sung et al. |
| 6,037,223 A | 3/2000 | Su et al. |
| 6,107,670 A | 8/2000 | Masuda |
| 6,136,652 A | 10/2000 | Hazani |
| 6,461,916 B1 * | 10/2002 | Adachi et al. .............. 438/257 |

* cited by examiner

Primary Examiner—David Nelms
Assistant Examiner—Tu-Tu Ho
(74) Attorney, Agent, or Firm—Laurence A. Greenberg; Werner H. Stemer; Ralph E. Locher

(57) ABSTRACT

A nonvolatile semiconductor memory cell, an associated semiconductor circuit configuration and also a fabrication method, in which, in a substrate, active regions are formed with a first insulating layer situated above them, a charge-storing layer, a second insulating layer and a control layer. In order to realize a particularly small cell area, in a third insulating layer situated thereabove, openings are formed above at least partial regions of source/drain regions, which are each directly contact-connected via the openings by source and drain lines formed on an insulating web.

21 Claims, 7 Drawing Sheets

NONVOLATILE SEMICONDUCTOR MEMORY CELL AND ASSOCIATED SEMICONDUCTOR CIRCUIT CONFIGURATION AND METHOD FOR THE FABRICATION OF THE CIRCUIT CONFIGURATION

CROSS-REFERENCE TO RELATED APPLICATION

This application is a continuation of copending International Application No. PCT/DE01/04006, filed Oct. 22, 2001, which designated the United States and was not published in English.

BACKGROUND OF THE INVENTION

Field of the Invention

The present invention relates to a nonvolatile semiconductor memory cell and to an associated semiconductor circuit configuration and an associated fabrication method, and in particular to a flash EPROM memory cell or an associated memory with a SNOR architecture, in which respective source and drain lines can be driven selectively.

In order to store relatively large volumes of data, magnetic disk drives are currently used by computer units or computers. However, such disk drives require a relatively large space and have a multiplicity of moving parts. Consequently, they are susceptible to disturbances and have a considerable current consumption. What is more, future computer units or computers and other digital devices such as, for example, digital cameras, music reproduction devices or palm devices will become smaller and smaller, which is why conventional mechanical storage devices are unsuitable.

As an alternative to such conventional mechanical storage devices, recently nonvolatile semiconductor memory devices have gained acceptance more and more, such as, for example, FLASH memories, $E^2$PROM, EPROM and the like. The so-called NAND and NOR semiconductor memory devices are known as the most important representatives of such electrically erasable and electrically programmable memory devices. In both semiconductor memory devices, the memory cells have so-called one-transistor memory cells, usually a drain region and a source region being formed in an active region of a semiconductor substrate and an insulated charge-storing layer being situated above the channel section in between the regions.

Whereas in NAND semiconductor circuit configurations a multiplicity of switching elements are connected in series with one another and are driven via a common selection gate or a selection transistor, the respective switching elements in NOR semiconductor circuit configurations are organized in parallel or in matrix form, as a result of which each switching element can be selected individually.

What is disadvantageous, however, in the case of conventional layouts is that a more than twice as intensive metallization is present on account of the additional source lines in comparison with a "common source" architecture, which represents a limiting factor for more extensive integration. Therefore, conventional SNOR semiconductor memory cells usually have an area of at least 12 $F^2$ and typically 20 $F^2$, where F represents a smallest structure width that can be realized lithographically. What is more, so-called lithography artefacts result particularly in the case of source and drain lines of meandering configuration, and can lead to a tapering through to interruptions of the respective lines.

SUMMARY OF THE INVENTION

It is accordingly an object of the invention to provide a nonvolatile semiconductor memory cell and an associated semiconductor circuit configuration and a method for the fabricating the circuit configuration that overcome the above-mentioned disadvantages of the prior art devices and methods of this general type, in which further integration can be realized in a simple manner.

With the foregoing and other objects in view there is provided, in accordance with the invention, a nonvolatile semiconductor memory cell. The memory cell contains a substrate, an active region formed in the substrate and serving to define source/drain regions, a first insulating layer formed on the substrate, a charge-storing layer formed on the first insulating layer, a second insulating layer formed on the charge-storing layer, a control layer formed on the second insulating layer and defining word line stacks, an insulating protective layer surrounding at least the word line stacks, and a third insulating layer formed over a whole area on the substrate and the word line stacks. The third insulating layer has openings formed therein. At least one insulating web has sidewalls and is formed on the third insulating layer and serves to define at least one bit line with a source line and a drain line at at least one of the sidewalls. The source and drain lines each directly make contact with the source/drain regions through the openings in the third insulating layer.

In particular as a result of the use of a third insulating layer with openings above at least partial regions of the source/drain regions, and an insulating web for forming at least one bit line with a source line and a drain line at at least one of its sidewalls, the source and drain lines each directly make contact with the source/drain regions via the openings, sublithographic structure widths are obtained for the source and drain lines, as a result of which a total cell area can be reduced down to 5 $F^2$. A storage density can be significantly increased in this way, thereby reducing the costs per memory unit.

Preferably, the source and drain lines are formed as spacers on the insulating web, thereby obtaining a structure width for the bit lines which essentially corresponds to a layer thickness for the line.

Preferably, the source and drain lines contain in situ-doped polysilicon, as a result of which the fabrication can be realized in a particularly simple manner with good conductivity.

The fourth insulating layer preferably represents a selective etching stop layer for the source and drain lines and also for the insulating web, as a result of which the fabrication method can be simplified further and the source and drain lines can be formed particularly simply and reliably. A silicon nitride layer, in particular, may advantageously be used as third insulating layer in this case, thus resulting in a high selectivity for the source and drain lines containing polysilicon and an insulating web containing TEOS oxide, for example, during etching.

An electrically conductive or electrically nonconductive layer is preferably used as the charge-storing layer.

In order to avoid so-called trench etchings in the active region, the source-drain lines and/or the openings may be formed in such a way that they overlap, thereby ensuring an improved contact connection, although at the expense of the cell size.

In accordance with an additional feature of the invention, the insulating layer is preferably formed of a tunnel oxide and the second insulating layer is formed of a coupling oxide.

Other features which are considered as characteristic for the invention are set forth in the appended claims.

Although the invention is illustrated and described herein as embodied in a nonvolatile semiconductor memory cell and an associated semiconductor circuit configuration and a method for the fabricating the circuit configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
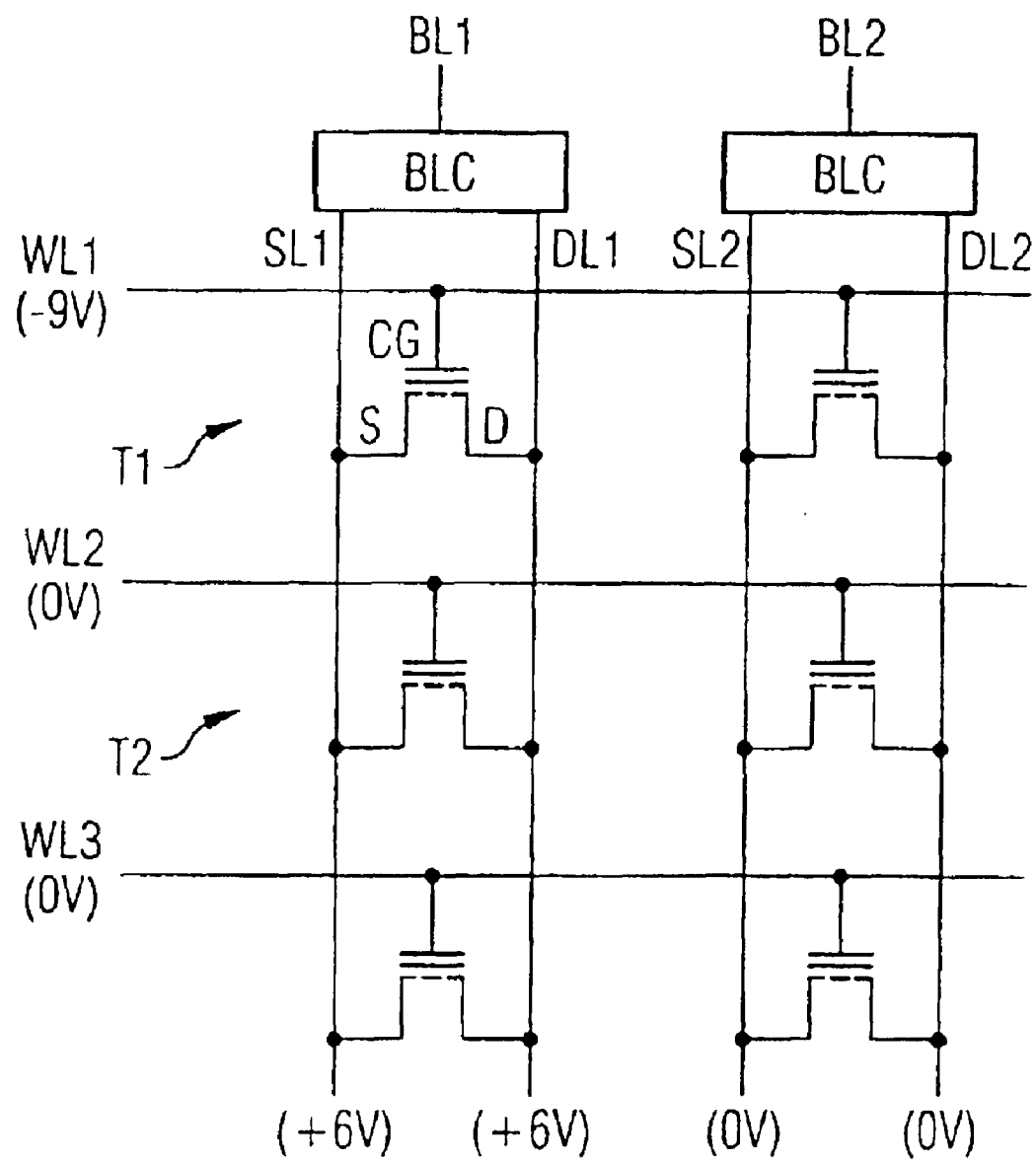
FIG. 1 is a simplified equivalent circuit diagram of a conventional semiconductor circuit configuration.

Referring now to the figures of the drawing in detail and first, particularly, to FIG. 1 thereof, there is shown a simplified illustration of a conventional SNOR semiconductor circuit configuration (selective NOR), in which, in contrast to the NOR semiconductor circuit configuration with "common source" architecture, the individual switching elements T1, T2, . . . are driven selectively via a respective source line SL1, SL2, . . . and via a respective drain line DL1, DL2, . . . . The selective driving is carried out for example by respective bit line controllers BLC which, as it were, realize common bit lines BL1, BL2, . . . . Further shrinks or more extensive integration of the semiconductor circuit configuration can be carried out in this way since the SNOR architecture does not rely on a predetermined minimum cell transistor length or channel length.

Figure 2:
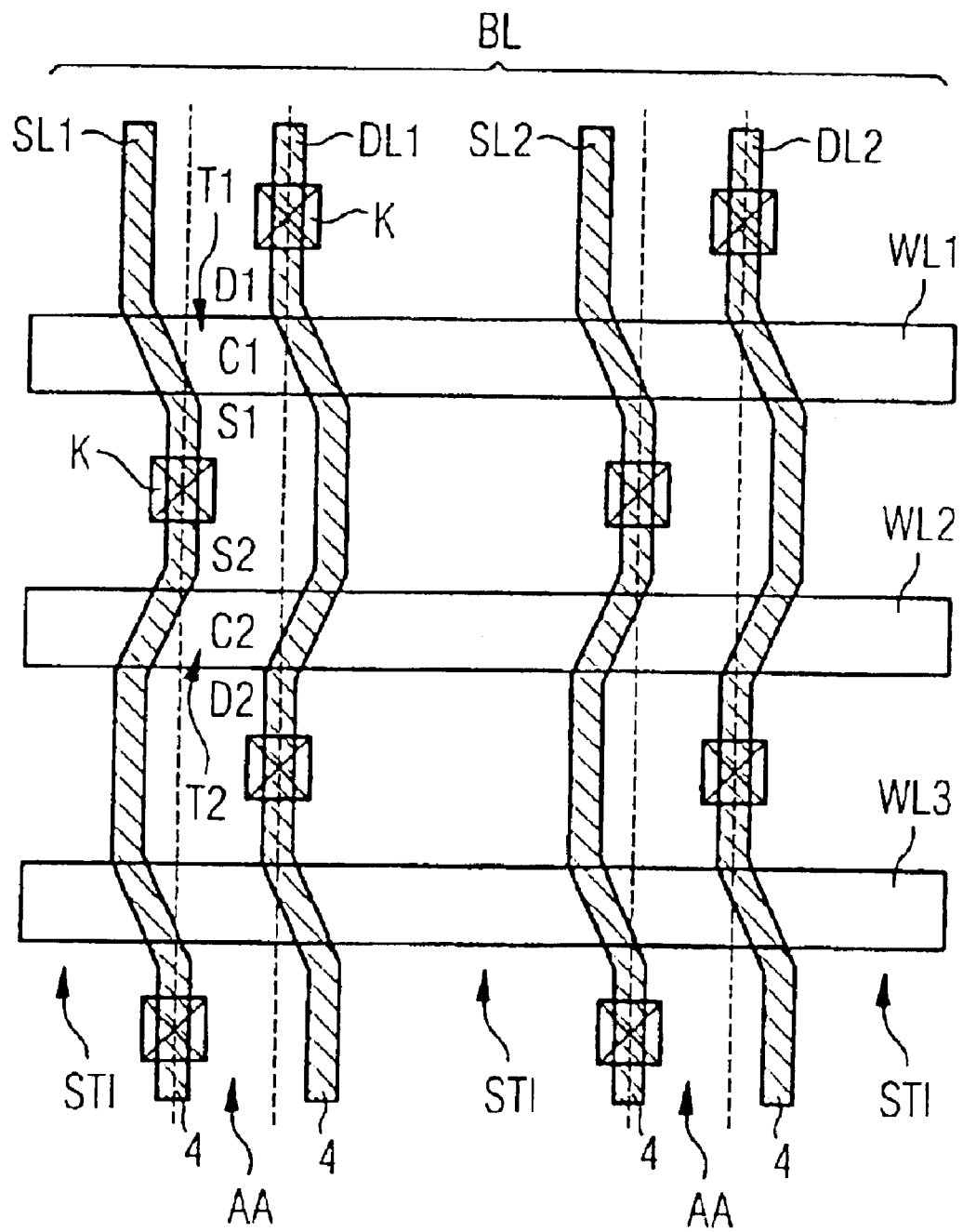
FIG. 2 is a diagrammatic, plan view of the conventional semiconductor circuit configuration in accordance with FIG. 1.

FIG. 2 shows a simplified illustration of a conventional layout of the SNOR semiconductor circuit configuration in accordance with FIG. 1. In accordance with FIG. 2, the switching elements T1, T2, . . . are formed in active regions of a semiconductor substrate that have an essentially straight strip-type structure. On the multiplicity of strip-type active regions AA disposed column wise there overlie, row wise, layer stacks likewise formed in strip form, a topmost layer representing a control layer or word line WL1 to WL3 of the switching elements T1, T2 . . . . Each crossover point or overlap region between such a strip-type active region AA and a word line WL1 to WL3 formed in strip form thus represents a multiplicity of switching elements T. Contacts K are necessary for making contact with respective drain regions D and source regions S, which contacts K are usually formed in the active region AA, but often may extend into an adjoining isolation region ST1 preferably being shallow trench isolation (STI). In a further layer lying above that, which preferably represents a first metallization layer, there are then situated the source lines SL1, SL2, . . . and also the drain lines DL1, DL2, . . . for the respective bit lines BL. In this case, the drain lines are connected to the associated drain regions D of the active region via corresponding contacts K, the source lines SL1 being connected to the associated source regions via corresponding contacts in the same way.

What is disadvantageous, however, in the case of such a conventional layout is that a more than twice as intensive metallization is present on account of the additional source lines in comparison with a "common source" architecture, which represents a limiting factor for more extensive integration. Therefore, such conventional SNOR semiconductor memory cells usually have an area of at least 12 $F^2$ and typically 20 $F^2$, where F represents a smallest structure width that can be realized lithographically. What is more, so-called lithography artefacts result particularly in the case of source and drain lines of meandering configuration, and can lead to a tapering through to interruptions of the respective lines.

Figure 3:
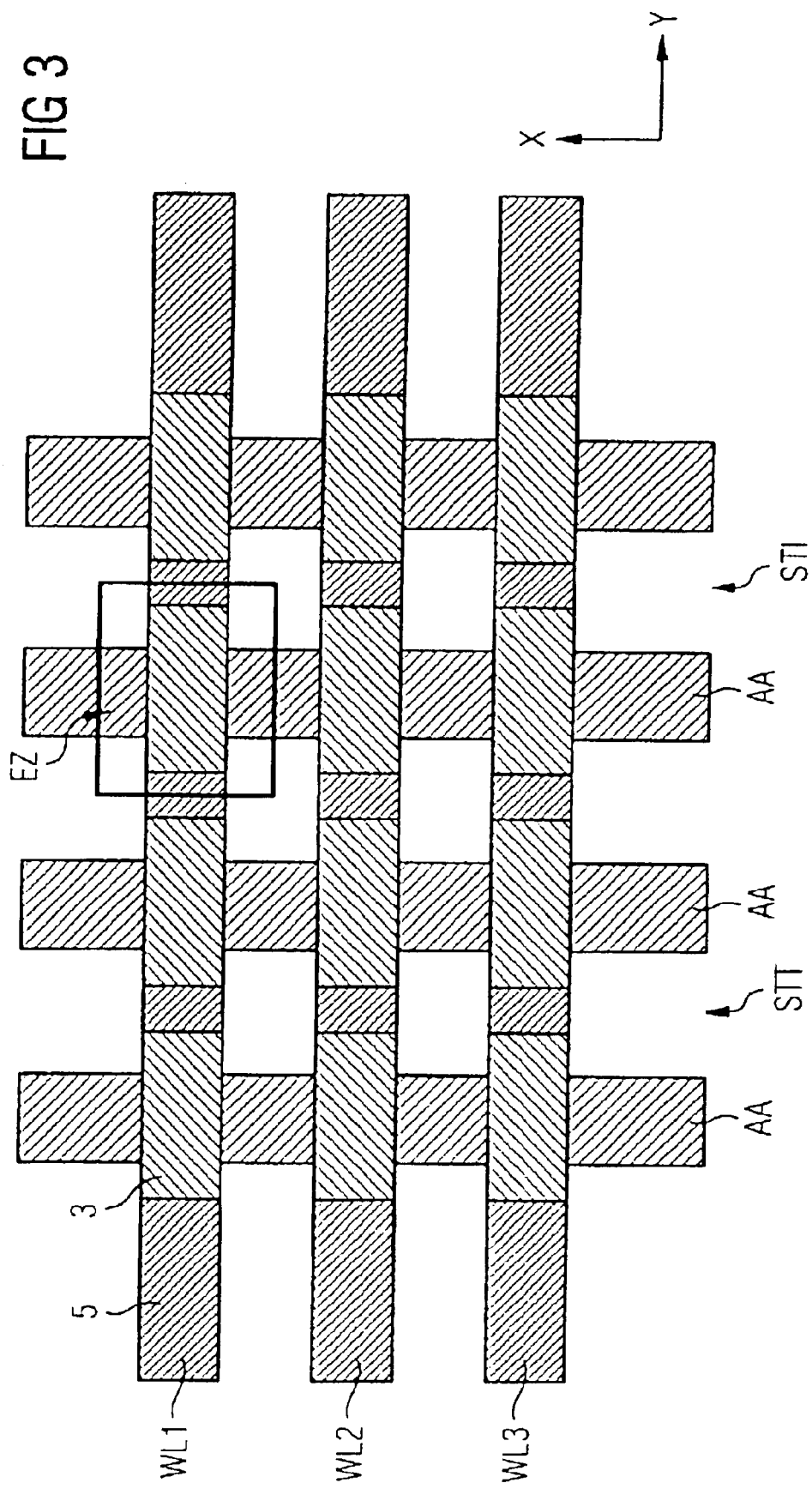
FIG. 3 is a diagrammatic, plan view of first fabrication steps for realizing the semiconductor circuit configuration according to the invention.

FIG. 3 shows a simplified plan view of the semiconductor circuit configuration according to the invention with a SNOR architecture after a multiplicity of first fabrication steps.

In order to fabricate the SNOR semiconductor circuit configuration illustrated in FIG. 3, the fabrication steps that are described below, but are not illustrated in any greater detail, are carried out. First, in a substrate 1 (e.g. Si semiconductor substrate), essentially straight active regions AA are formed for example by trench isolation, in particular a shallow trench isolation (STI) being used. Since the active regions AA are formed in an essentially straight fashion, no problems whatsoever arise during the lithography on account of edges or complicated geometrical forms.

Figure 6:
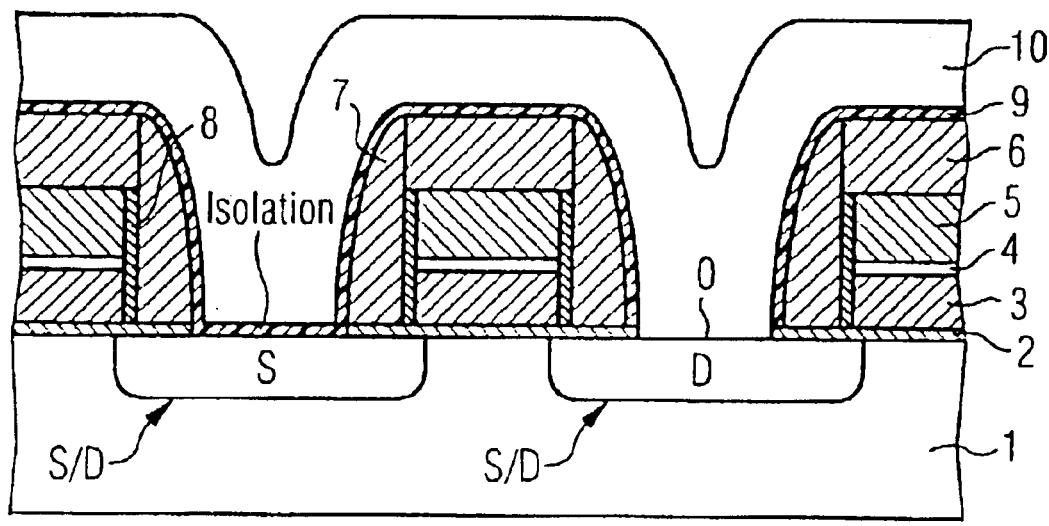
FIG. 6 is a diagrammatic, sectional view of the semiconductor circuit configuration taken along the line VI—VI shown in FIG. 5.

Afterward, a first insulating layer 2 is formed over the whole area on a wafer surface or in the region of the active regions AA, which insulating layer 2 preferably represents a tunnel oxide layer and is formed for example as thermal silicon dioxide (see FIGS. 3 and 6). However, the first insulating layer 2 may, in the same way, also be formed by a deposition method or otherwise. In the preferred exemplary embodiment, a switching element contains a one-transistor memory cell EZ, for which reason, in a subsequent step, a charge-storing layer 3 is formed preferably by deposition of polysilicon as a "floating gate". However, the invention is not restricted to such an electrically conductive charge-storing layer, but rather also encompasses, in the same way, electrically nonconductive charge-storing layers as are used for example in so-called SONOS cells.

In order to realize charge-storing layers that are electrically isolated from one another, in a further fabrication step, the charge-storing layer 3 can then be subjected to a first patterning in an x direction, the strip-type charge-storing layer first being formed in the direction of the active regions AA. After the patterning step, which is usually carried out by photolithographic processes, a second insulating layer 4, a first conductive layer 5 and a partial protective layer 6 are deposited on the wafer in subsequent fabrication steps. As the second insulating layer 4, preferably a layer sequence containing oxide/nitride/oxide (ONO) is deposited as a so-called coupling oxide, it also being possible to use other dielectric layers with a high $\epsilon_r$. As the first conductive layer 5, by way of example, a further highly doped electrically conductive polysilicon layer is deposited, which realizes a later word line. A hard mask is preferably used as the partial protective layer 6.

In a subsequent fabrication step, using a non-illustrated resist and conventional lithography, essentially straight word line stacks are etched by patterning the partial protective layer 6, the control layer 5 and the second insulating layer 4 preferably by dry etching using the partial protective layer 6 as a mask in the y direction and afterward, in the same way, the second insulating layer 4 and also the charge-storing layer 3 are removed selectively with respect to the first insulating layer 2, as a result of which islands of the charge-storing layer 3 are formed. Finally, the etched word line stack is subjected to an after treatment, in which case, by way of example, polymers are removed and the wafer surface is cleaned.

In an optional additional fabrication step, side insulating layers 8 may be formed, preferably as an oxide, on the sidewalls of the word line stacks, a thermal oxidation, for example, being carried out. Afterward, source/drain regions SID are formed in the active regions AA of the semiconductor substrate 1 preferably by ion implantation using the word line stacks in a self-aligning manner, symmetrical junctions usually being used. Asymmetrical p/n junctions may be realized for example by additional masking steps.

Afterward, so-called spacers 7 are formed as a further part of the protective layer for the semiconductor memory cell on the sidewalls of the word line stacks, in which case, by way of example, an insulating layer is deposited and etched back anisotropically.

Removal of the first insulating layer 2, which can actually also be removed at an earlier point in time, yields the plan view of the SNOR semiconductor circuit configuration according to the invention as illustrated in FIG. 3.

In a subsequent fabrication step, a third insulating layer 9 is formed over the whole area on the wafer. For this purpose, an etching stop layer that acts selectively for subsequent layers is preferably formed as the third insulating layer 9. By way of example, such an etching stop layer may be formed by depositing a silicon nitride over the whole area with a sufficient thickness.

Figure 4:
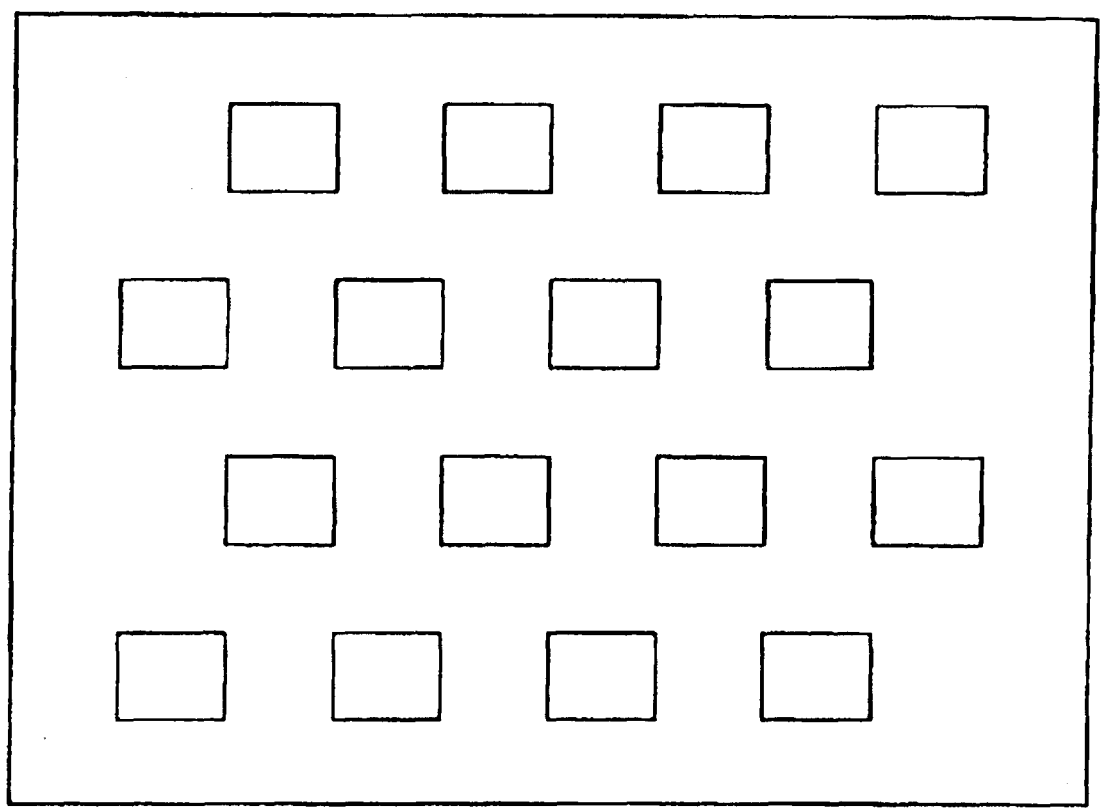
FIG. 4 is an illustration of a mask required for forming openings according to the invention.

Using a mask illustrated in FIG. 4, predetermined openings O are subsequently formed in the third insulating layer 9, for example by a short dry etching process, which openings essentially lie between the respective word line stacks and at least partially uncover the active regions AA.

Figure 5:
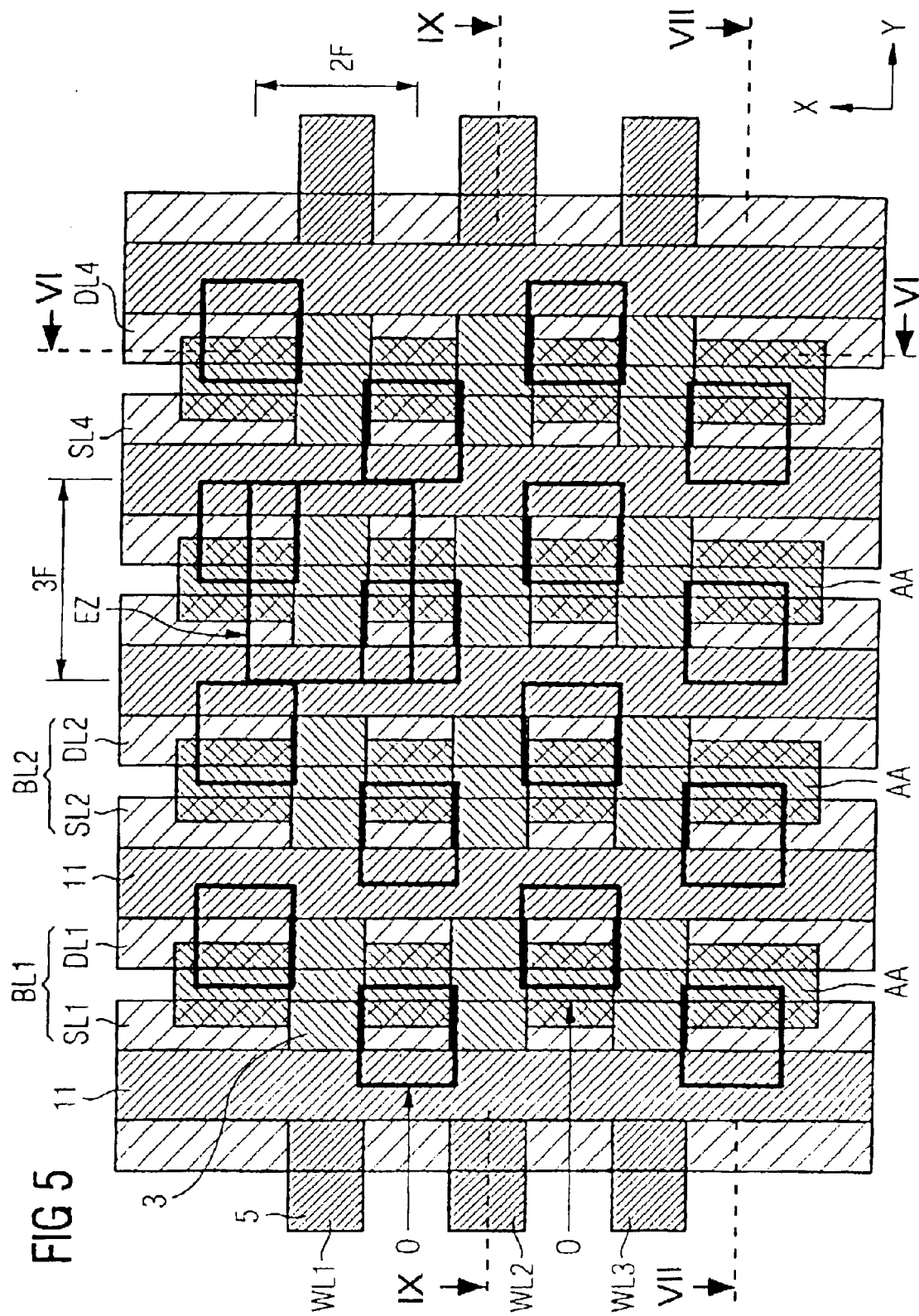
FIG. 5 is a diagrammatic, plan view of further fabrication steps for realizing the semiconductor circuit configuration according to the invention.

In accordance with FIG. 5 the opening O are situated directly between two adjacent word line stacks or word lines WL1, WL2, WL3, . . . and are essentially formed in zigzag form over the active region AA in such a way that the latter is half or only partially uncovered. In accordance with FIG. 5, the openings O have a square form. However, they may also have any other form desired and, in particular, be reduced in size or enlarged and/or disposed in a manner shifted with respect to the active region AA, as a result of which it is possible to eliminate so-called trench problems, which are described later.

In accordance with FIG. 5, in subsequent fabrication steps after the formation of the openings O in the third insulating layer 9, an insulating web layer 11 (dummy layer) is formed over the whole area and patterned lithographically essentially in the x direction, thereby producing insulating webs 11 which, in accordance with FIG. 5, are disposed for example between respective active regions AA. In this way, height differences that occur, which are produced in particular by the charge-storing layers or islands 3, can be compensated for in an advantageous manner. In principle, however, such insulating webs 11 can also be disposed directly over the active regions AA. By way of example, as the web layer or for the insulating webs 11, an oxide may be deposited and patterned as a so-called dummy layer. Particularly with the use of such a silicon oxide the result is a selective etching process with respect to the third insulating layer 9 used as an etching stop layer.

In a subsequent fabrication step, a bit line layer 10 is then deposited over the whole area on the wafer and withdrawn in a subsequent method step in such a way as to produce the source and drain lines SL1, DL1, SL2, DL2, . . . on sidewalls of the insulating webs 11. In this case, by way of example, a deposition of in situ-doped polysilicon may be carried out, the source and drain lines subsequently being patterned by use of spacer etching. The spacer etching used in this case is an anisotropic dry etching during which the bit line layer is essentially removed only in one direction. On account of the insulating webs 11 used and the subsequent withdrawal of the bit line layer, sublithographic source and drain lines SL1 to DL2 which lie at a sufficient distance within two lithographically formed webs are produced given a corresponding thickness for the bit line layer 10.

FIG. 6 shows a simplified sectional view of the SNOR semiconductor circuit configuration according to the invention in accordance with a section line VI—VI shown in FIG. 5, identical reference symbols designating identical or corresponding layers, for which reason a repeated description is dispensed with below.

In accordance with FIG. 6, on account of the opening O disposed in zigzag form, only every second source/drain region S/D is uncovered, while the remaining part is covered over the whole area by the third insulating layer 9. Accordingly, for the drain line DL4 formed on the sidewall of the insulating web 11, a direct contact with the active region AA results only for every second source/drain region. Accordingly, all the drain regions can be contact-connected with the respective drain line (e.g. DL4), while a source line SL4, not illustrated in FIG. 6, makes contact with the further source regions S. In order to form an ohmic contact, the bit line layer 10 and the respective source/drain regions S/D each have the same conductivity type (p or n). With the use of metals for the bit line layer, however, the conductivity type is not important.

Figure 7:
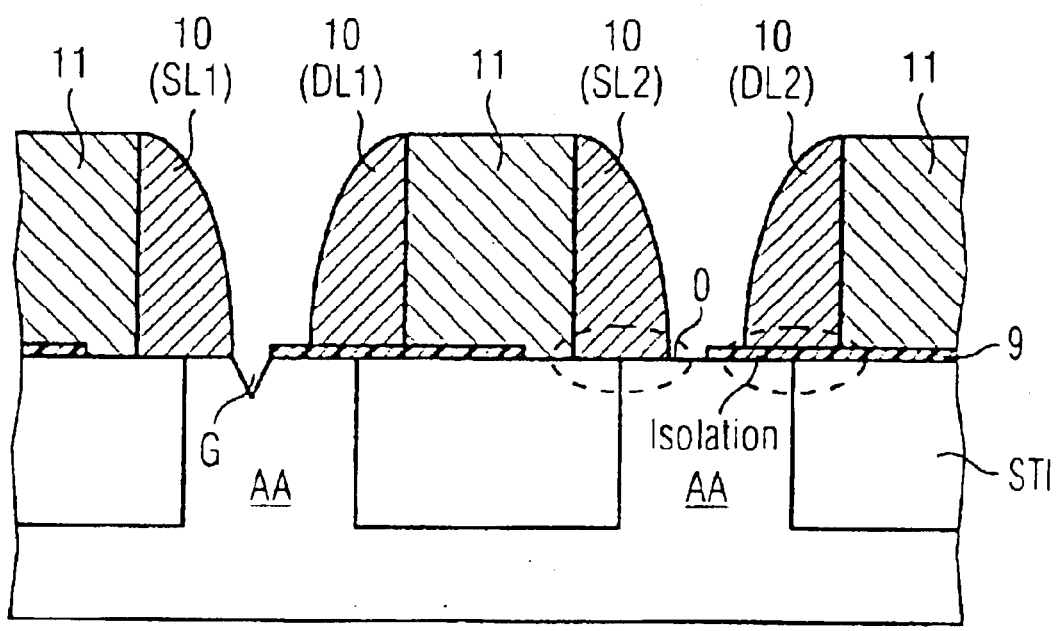
FIG. 7 is a diagrammatic, sectional view of the semiconductor circuit configuration taken along the line VII—VII shown in FIG. 5.

FIG. 7 shows a further simplified sectional view of the SNOR semiconductor circuit configuration according to the invention in accordance with section line VII—VII shown in FIG. 5, identical reference symbols again designating identical layers and a repeated description being dispensed with below.

In accordance with FIG. 7, given a predetermined form and size of the openings O in the third insulating layer 9 and also a predetermined thickness of the bit line layer 10 or the associated source lines and drain lines, an overetching can take place in the active region AA, thereby forming so-called trenches G in the substrate or in the active region at the edge of the third insulating layer 9. This can result in reduced conductivities in the source/drain regions S/D or impair the fundamental functionality.

In order to avoid such an overetching during the formation of the source and drain lines SL1 to DL2, the openings O and also the source and drain lines can be dimensioned or shifted in such a way that an overlap is produced and a formation of trenches is reliably prevented.

Figure 8:
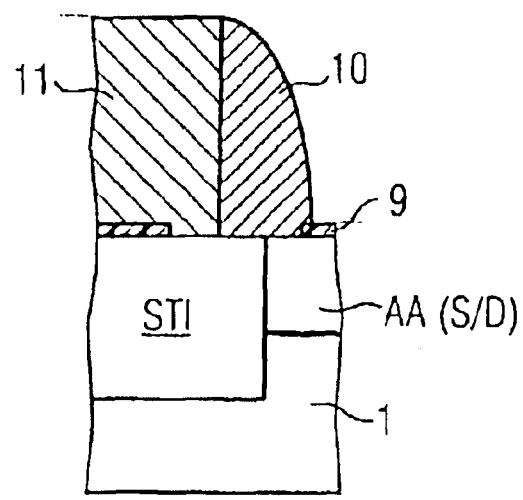
FIG. 8 is a diagrammatic, enlarged sectional view of the semiconductor circuit configuration according to the invention in accordance with a further exemplary embodiment.

FIG. 8 shows a partial sectional view of FIG. 7 for such a further exemplary embodiment, the openings in the third insulating layer 9 being reduced in size such that the source and drain lines formed or the associated bit line layer 10 has a sufficient overlap. In order to realize such an overlap region, it is possible, in the same way, to vary a thickness of the bit line layer 10 or a positioning of the openings O. This results in a reliable contact connection with the respective source/drain regions S/D in the active region AA of the substrate 1, without the risk of trench formation.

Figure 9:
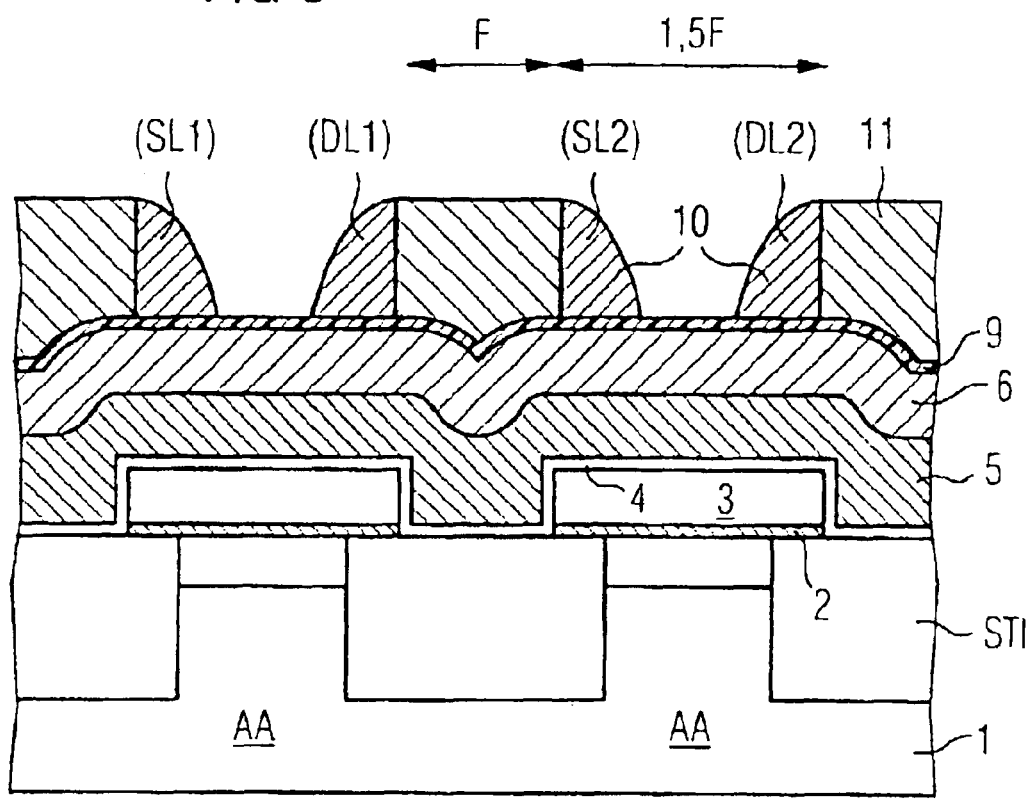
FIG. 9 is a diagrammatic, sectional view of the semiconductor circuit configuration according to the invention taken along the line IX—IX shown in FIG. 5.

FIG. 9 shows a simplified sectional view of the semiconductor circuit configuration according to the invention in accordance with section line IX—IX shown in FIG. 5, identical reference symbols designating identical layers and a repeated description being dispensed with below.

The significant reduction of the cell size can be seen in accordance with FIG. 9, according to which, in the most favorable case, only 2.5×F are required for the active regions AA and the insulating webs 11 with their source and drain lines SL1 to DL2. Given a typical cell width of 2 F, this results in a minimum cell area of 2.5 F×2 F=5 $F^2$ compared with a minimum of 12 $F^2$ in accordance with the prior art. Using customary alignment tolerances, in accordance with the present invention a cell area of typically 6 $F^2$ is produced compared with typically 20 $F^2$ in accordance with the prior art. Accordingly, a significant reduction of the cell area is produced even with the use of, in principle, area-intensive SNOR semiconductor memory cells.

The invention has been described above on the basis of a silicon nitride layer, an oxide layer and a polysilicon layer for the third insulating layer, the web layer and the bit line layer. However, it is not restricted thereto, but rather encompasses all further materials for these layers in which the third insulating layer acts as a selective etching stop layer for the overlying layers. In the same way, the charge-storing layer 3 contains an electrically conductive layer. However, it may, in the same way, contain an electrically nonconductive layer and have a monolayer or multilayer structure. The bit line layer was deposited as in situ-doped polysilicon layer; however, it may, in the same way, also contain some other electrically conductive layer or have a multilayer structure such as e.g. siliconized silicon.

Furthermore, a further etching step may be used for removing end regions of the source and drain lines at the end of the insulating webs 11, as a result of which short circuits between these lines can be reliably removed.

Furthermore, the openings O may also be disposed in essentially rectilinear fashion, in which case, however, a meandering structure and zigzag structure are produced for the insulating webs and the associated source and drain lines.

I claim:

1. A nonvolatile semiconductor memory cell, comprising:
   a substrate;
   an active region formed in said substrate and serving to define source/drain regions;
   a first insulating layer formed on said substrate;
   a charge-storing layer formed on said first insulating layer;
   a second insulating layer formed on said charge-storing layer;
   a control layer formed on said second insulating layer and defining word line stacks;
   an insulating protective layer surrounding at least said word line stacks;
   a third insulating layer formed over a whole area on said substrate and said word line stacks, said third insulating layer having openings formed therein; and
   at least one insulating web having sidewalls formed on said third insulating layer and serving to define at least one bit line with a source line and a drain line at at least one of said sidewalls, said source and drain lines each directly making contact with said source/drain regions through said openings in said third insulating layer.

2. The nonvolatile semiconductor memory cell according to claim 1, wherein said source and drain lines are formed as spacers on said insulating web.

3. The nonvolatile semiconductor memory cell according to claim 1, wherein said source and drain lines are formed of situ-doped polysilicon.

4. The nonvolatile semiconductor memory cell according to claim 1, wherein said insulating web are formed of a TEOS oxide.

5. The nonvolatile semiconductor memory cell according to claim 1, wherein said third insulating layer is formed as a nitride layer.

6. The nonvolatile semiconductor memory cell according to claim 1, wherein said charge-storing layer has one of an electrically conductive layer and an electrically nonconductive layer.

7. The nonvolatile semiconductor memory cell according to claim 1, wherein said source and drain lines at least partially cover said openings.

8. The nonvolatile semiconductor memory cell according to claim 1, wherein said first insulating layer has a tunnel oxide and said second insulating layer has a coupling oxide.

9. A nonvolatile semiconductor circuit configuration having a multiplicity of semiconductor memory cells disposed in a matrix form, comprising:
   a substrate;
   active regions formed in said substrate and serving to define source/drain regions;
   a first insulating layer formed on said substrate;
   a charge-storing layer formed on said first insulating layer;
   a second insulating layer formed on said charge-storing layer;
   control layers formed on said second insulating layer and defining word line stacks, said control layers disposed in a row form;
   an insulating protective layer surrounding at least said word line stacks;
   a third insulating layer formed over a whole area on said substrate and said word line stacks, said third insulating layer having openings formed therein, said openings substantially disposed in zigzag form such that said active regions being at least partially uncovered; and
   insulating webs having sidewalls formed on said third insulating layer and serving to define bit lines with source lines and drain lines at at least one of said sidewalls, said source and drain lines each directly making contact with said source/drain regions through said openings in said third insulating layer, said active regions, said insulating webs and said respective ones of said source and drain lines disposed in column form.

10. A method for fabricating a semiconductor circuit configuration, which comprises the steps of:

providing a substrate;

forming substantially straight active regions in the substrate;

forming a first insulating layer on the substrate;

forming charge-storing layer on the first insulating layer;

patterning the charge-storing layer in an x direction;

forming a second insulating layer on the charge-storing layer;

forming a control layer on the second insulating layer;

forming a partial protective layer on the control layer;

patterning the partial protective layer, the control layer, the second insulating layer and the charge-storing layer in a y direction for forming substantially straight word line stacks;

forming source/drain regions in the active region of the substrate;

forming spacers on sidewalls of the word line stacks;

removing areas of the first insulating layer that are not covered;

forming whole-area wide a third insulating layer on the substrate;

forming openings in the third insulating layer for uncovering at least partially the active regions;

forming an insulating web layer on the third insulating layer;

patterning the insulating web layer in the y direction for forming insulating webs;

forming a bit line layer; and shaping the bit line layer for forming source and drain lines on sidewalls of the insulating webs.

11. The method according to claim 10, which further comprises carrying out a spacer etching step during the shaping step.

12. The method according to claim 11, which further comprises carrying out an anisotropic dry etching as the spacer etching step.

13. The method according to claim 10, which further comprises carrying out a formation of the openings and the shaping step such that the source and drain lines overlap the third insulating layer at the openings.

14. The method according to claim 10, which further comprises removing end regions of the source and drain lines at an end of the insulating webs.

15. The method according to claim 10, which further comprises depositing an in situ-doped polysilicon layer as the bit line layer.

16. The method according to claim 10, which further comprises forming the third insulating layer as an etching stop layer being selective with respect to the insulating web layer and with respect to the bit line layer.

17. The method according to claim 10, which further comprises forming the charge-storing layer as an electrically conductive layer.

18. The method according to claim 10, which further comprises forming the charge-storing layer as an electrically nonconductive monolayer.

19. The method according to claim 10, which further comprises forming the charge-storing layer as a multilayered layer formed of an electrically conductive layer and an electrically nonconductive layer.

20. The method according to claim 10, which further comprises forming the third insulation layer as a silicon nitride layer.

21. The method according to claim 10, which further comprises forming the bit line layer and the source/drain regions to have equivalent conductivity types.

* * * * *